US 6,703,839 B2

(12) United States Patent
Slamecka (10) Patent No.: US 6,703,839 B2
(45) Date of Patent: Mar. 9, 2004

(54) SYNTHETIC MAKING/BREAKING-CAPACITY TEST CIRCUIT FOR HIGH-VOLTAGE ALTERNATING-CURRENT CIRCUIT-BREAKERS

(76) Inventor: Ernst Slamecka, Alt-Pichelsdorf 13, Berlin D-13595 (DE)

( * ) Notice: Subject to any disclaimer, the term of this patent is extended or adjusted under 35 U.S.C. 154(b) by 81 days.

(21) Appl. No.: 10/147,552

(22) Filed: May 17, 2002

(65) Prior Publication Data

US 2003/0214302 A1 Nov. 20, 2003

(30) Foreign Application Priority Data

May 20, 2001 (EP) .............................. 01250178

(51) Int. Cl.$^7$ .............................................. G01R 31/02
(52) U.S. Cl. ................................ 324/424; 361/117
(58) Field of Search .......................... 361/58, 115, 117, 361/130, 134; 324/424, 418, 420, 422, 423, 535, 536

(56) References Cited

U.S. PATENT DOCUMENTS 3,867,686 A * 2/1975 St-Jean ..................... 324/424
5,153,518 A * 10/1992 Satoh et al. ............... 324/424

FOREIGN PATENT DOCUMENTS

| DE | 963731 | 4/1942 |
| DE | 975303 | 4/1942 |
| DE | 1 541 852 | 9/1969 |
| DE | 1 616 035 | 4/1970 |
| DE | 1 938 872 | 2/1971 |
| DE | 2 528 100 | 8/1977 |
| GB | 1 242 400 | 8/1971 |
| GB | 1 535 814 | 12/1978 |

OTHER PUBLICATIONS

International Electrotechnical Commission, "International Standard 60427—Synthetic Testing of high–voltage alternating current circuit breakers," IEC (Switzerland), ( Aug. 27, 2000).
Slamecka, "Abstract from dissertation, Technische Hochschule Graz," ( Aug. 27, 1955).

* cited by examiner

Primary Examiner—N. Le
Assistant Examiner—Vincent Q. Nguyen
(74) Attorney, Agent, or Firm—Hahn Loeser + Parks LLP; Stephen L. Grant (57) ABSTRACT

A high-voltage oscillating circuit (I) is connected in parallel with an auxiliary circuit-breaker ($B_a$) by firing a switching spark gap ($SG_{hv}$) and the oscillating current ($i_{hv}$) is superimposed on the high-current ($i_{hc}$) with opposite polarity just before the high-current zero crossing. The spark gap ($SG_{hc}$) is fired at the artificial current zero, causing: short-circuiting of the high-current source (a), series connection of the high-voltage oscillating circuit with the test circuit-breaker ($B_t$), oscillating current from the auxiliary circuit-breaker is transferred with constant parameters to the test circuit-breaker there—in following the eliminated high current. Transient high voltage follows the zero crossing of the synthetic current continuously.

9 Claims, 10 Drawing Sheets

$120 \times 10^{-6}$ s

SYNTHETIC MAKING/BREAKING-CAPACITY TEST CIRCUIT FOR HIGH-VOLTAGE ALTERNATING-CURRENT CIRCUIT-BREAKERS

The present invention relates to synthetic making/breaking-capacity test circuits with the characteristics specified in the preamble of claim 1. A synthetic breaking-capacity test circuit of this kind is already known from German patent specification 962 731, dated Apr. 3, 1942 by inventor Fritz Weil.

BACKGROUND OF THE ART

In the circuit diagram (FIG. 1), which corresponds functionally to the original FIG. 3 of the '731 specification, the original reference symbols have been supplemented with internationally recognized symbols representing the depicted circuit elements.

A partial oscillation of the high current $i_{hc}$ (FIG. 2), fed by a generator G, flows initially in the high-current circuit as a result of the series connection of the auxiliary circuit-breaker $9/B_a$ and the test circuit-breaker $3/B_t$. The high-voltage circuit does not operate as long as the switching spark gap $8/SG_{hv}$ is open, and it is additionally isolated from the high-current circuit by the open spark gap 7.

At the instant $t_0$ (FIG. 3), the high-voltage oscillating circuit with the capacitor $21/C_{hv}$, which is charged to electrical potential, is closed when the switching spark gap $8/SG_{hv}$ is fired.

Figure 5:
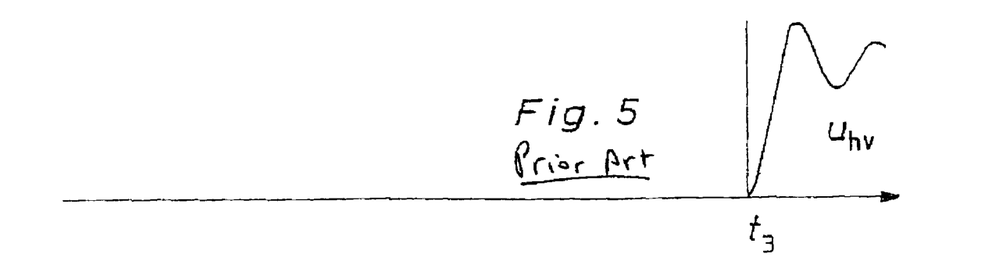
FIG. 5 is a transient voltage of the high-voltage oscillating circuit after the zero crossing of the oscillating-current half-oscillation.

An oscillating-current half-oscillation $i_{hv}$ then flows via an "interrupter 6 with a high voltage drop". The instant $t_0$ is selected so that the zero crossing of the oscillating-current half-oscillation occurs at the instant $t_3$ just after the zero crossing of the high current (instant $t_2$). At the instant $t_1$, which marks the "greatest coincidence of the two currents"—in FIGS. 2 and 3 when the oscillating current has a relative instantaneous value of $i_{hv}/\hat{I}_{hv}$ equal to 0.87, equivalent to a phase angle of 120°—"means are provided for eliminating the main current from the test switching point and conducting the current from the high-voltage source via the test switching point" (FIGS. 3 and 4). The recovery voltage $u_{hv}$ of the high-voltage source follows the current zero of the currents of the high-voltage source (FIG. 5).

Figure 2:
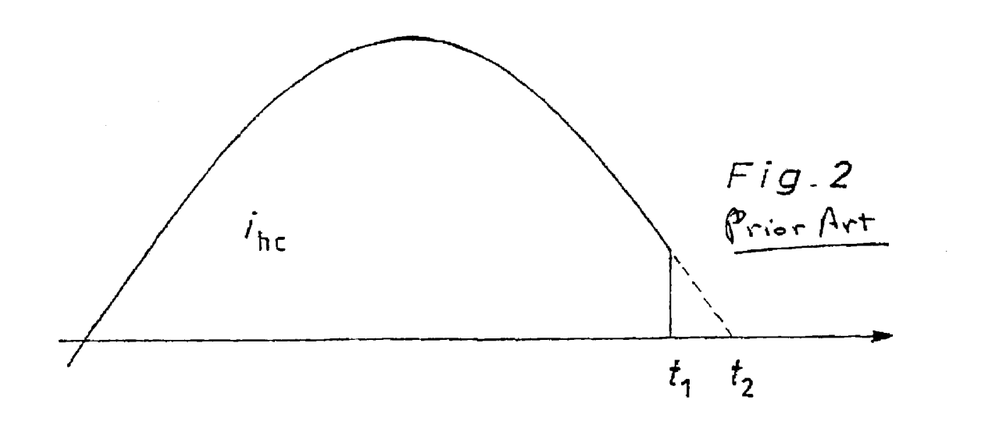
FIG. 2 is a high-current half-oscillation in the test circuit-breaker up to the point at which it is eliminated by a generator short-circuit.
Figures 3, 4:
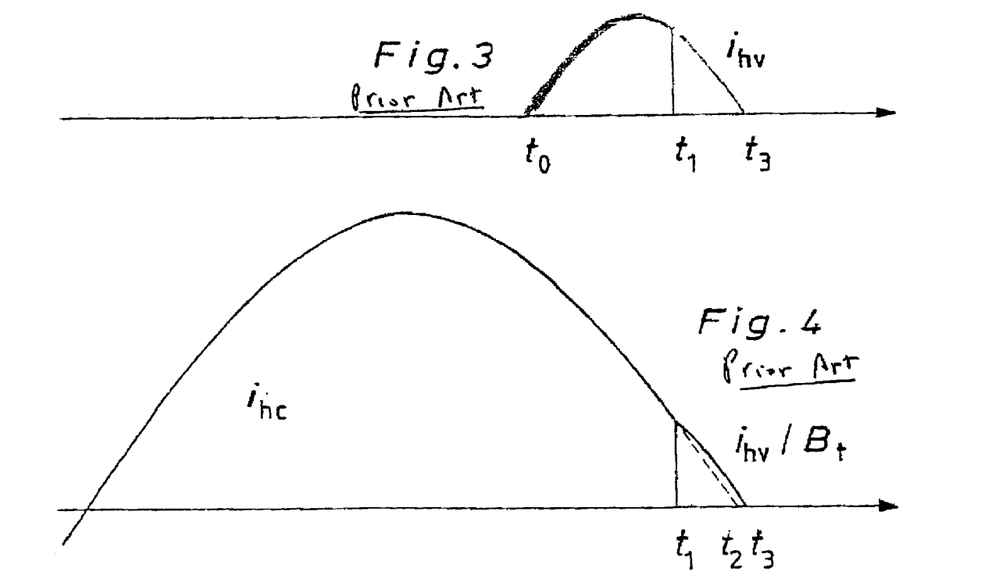
FIG. 3 is an oscillating current in the high-voltage oscillating circuit, which is still outside the high-current circuit.
FIG. 4 is a high-current half-oscillation with oscillating current transferred to the test circuit-breaker.

The current curves on the graphs in FIGS. 2, 3 and 4 were determined without taking account of the arc voltage of the circuit-breaker; the same also applies to all other graphs of current curves.

The actual redirection of the high-voltage oscillating current from the high-voltage oscillating circuit, which was originally made operational outside the high-current circuit, into the test circuit-breaker located in the high-current circuit as a sequence current of the high current that must be eliminated synchronously is likely to represent the main problem with this synthetic test circuit.

Figure 1:
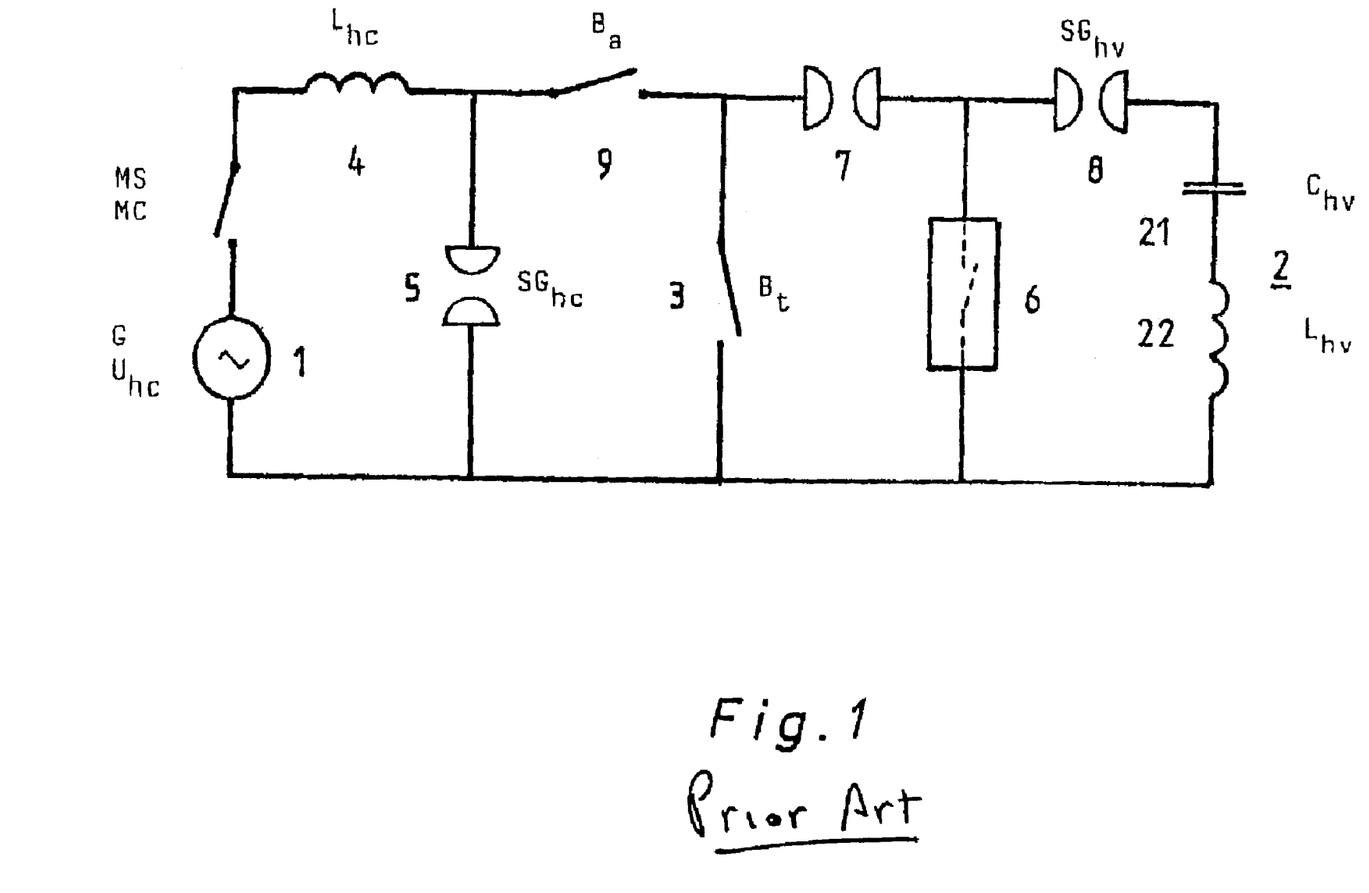
FIG. 1 is a circuit diagram with high-current circuit and high-voltage transient circuit, corresponding to the original FIG. 3.

To F. Weil, the state of the art which led to the invention was: " . . . the known test setup has the disadvantage that the main-current curve just before its zero crossing and the use of the high voltage as recovery voltage respectively conflicts with the situation of the natural test. This is due to the fact that the high-voltage source is already switched to the test switching point before the main-current zero, so that the two currents are superimposed at the switching point and therefore yield a value which is too high. "The circuit diagram of this "test setup" is elementarily obtained by resituating the Weil circuit (FIGS. 1 and 3 respectively).

This circuit is a synthetic test circuit which was already known to "AEG-Transformatorenfabrik Oberschoeneweide (Berlin)" under the designation "artifical circuit" (J. Biermanns); famous names in high-voltage engineering and circuit-breaker physics, such as G. Stem, J. Biermanns and O. Mayer, were associated with this factory, which established the world's first high-power testing laboratory (1912) but no longer exists today, and it is there that F. Weil worked.

The above-cited excerpt from the state of the art as base of the Weil circuit is the object of German patent specification 975 303, "Supplement to (Weil) patent 962 731", dated Apr. 2, 1950, by inventor Guenther Dobke.

Figure 12:
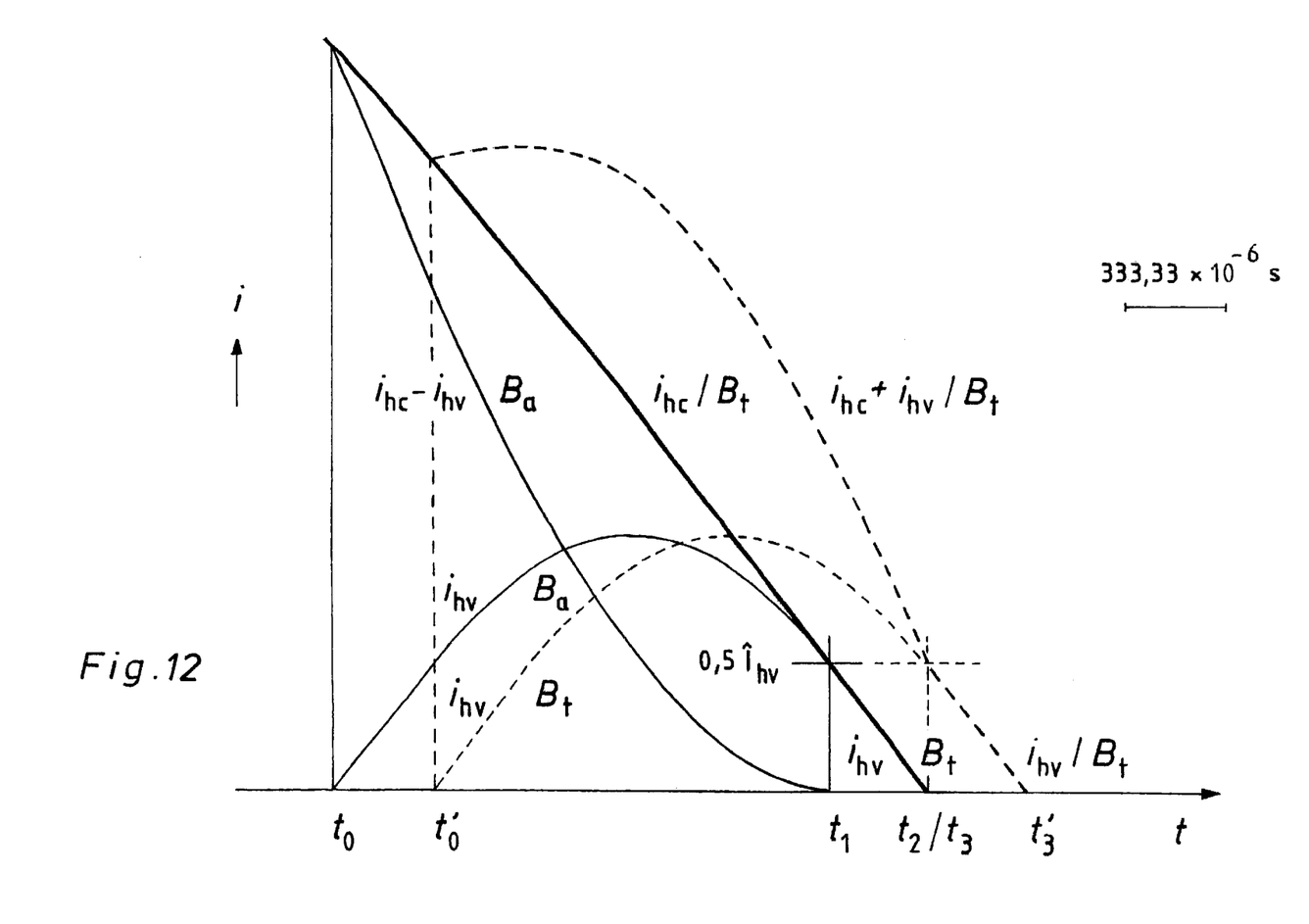
FIG. 12 is a solid polyline: oscillating-current injection in the auxiliary circuit-breaker, oscillating-current sequence current in the test circuit-breaker, AER=0.98; discontinuous polyline: oscillating-current injection and sequence current in the test circuit-breaker, AER=1.12.

As already aptly mentioned by F. Weil, the superimposition of the main current and the current from the high-voltage source produces a significantly distorted synthetic current in the switching gap of the test circuit-breaker, compared to a homogeneous, sinusoidal current (FIGS. 2b, 2a). Even if the synthetic current curve for the test circuit-breaker is determined graphically on the basis of physically correct assumptions about the oscillating current flow, the current distortion is still clearly visible: "Investigation of the AEG test circuit for high-power circuit breakers", E. Slamecka, dissertation script, Graz Technische Hochschule in 1955 and IEC publication 60427, Third Edition 2000–04, page 95, FIGS. BB. 1 and BB. 2. Refer also to FIG. 12, Graph with broken polyline.

A synthetic test circuit with sequence current exclusively in the test circuit-breaker, and with a high-voltage oscillating circuit which is transferred during the operating time from a circuit connected in parallel with the auxiliary circuit-breaker to a circuit connected in series with the high-current source and the test circuit-breaker, is known from: IEC publication 60427, Third Edition 2000–04, page 97, FIGS. BB. 3 and BB. 4.

A more detailed examination reveals the relative complexity of calculating and handling this synthetic breaking-capacity test circuit. This is compounded by a further problem: in the event of a voltage breakdown in the switching gap of the test circuit-breaker—not an uncommon occurrence during the development phase of a high-voltage circuit-breaker—the insulation of the high-current circuit is abruptly stressed by the voltage of the high-voltage oscillating circuit.

A generally known solution for limiting the cost of synthetic breaking-capacity test circuits with synthetic current is to allow the zero of this current to be followed by a synthetic transient voltage, and to incorporate a second high-voltage oscillating circuit for this purpose using a second auxiliary circuit-breaker.

In German patent specification 1938 872 the first high-voltage oscillating circuit is initially connected in parallel with the test circuit-breaker with superimposed current and sequence current in the switching gap of this circuit-breaker~ the second auxiliary circuit-breaker is located in a conductor section of the first high-voltage oscillating circuit.

In German patent specification 25 28 100 the first high-voltage oscillating circuit is initially connected in parallel with the first auxiliary circuit-breaker, before changing to a series connection with the test circuit-breaker and the high-source; the second auxiliary circuit-breaker is arranged in a conductor section of the high-current circuit.

In the two synthetic, two-circuit test circuits the above-mentioned specific problems relating to the synthetic basic circuits still exist.

A synthetic test circuit for testing the making capacity of a high-voltage alternating-current circuit-breaker is known from IEC Publication 60427, Third Edition 2000–04, page 59, FIG. 6. A high-current switching spark gap is used to connect the high-current source to the test circuit-breaker electronically after the voltage from the high-voltage source has pre-arced in the circuit-breaker switching gap, to enable the high-current to follow the pre-arcing CUITent. With only one function, this spark gap is too little effective utilized in a synthetic test circuit from a technical and economical point of view.

The invention problems are as follows: first, to generate a transient high voltage, which continuously follows the zero crossing of the short-circuit current, at the switching gap of the test circuit-breaker in a high-current circuit with an auxiliary circuit-breaker, by means of a high-voltage oscillating circuit that cooperates with the high-current circuit by oscillating current supply into the auxiliary circuit-breaker and by transferring this oscillating current from the auxiliary circuit-breaker into the test circuit-breaker at a defined phase angle with constant parameters as sequence current of the high current; furthermore: to identify potentials for improvement that are inherent in the invention and realization as new technology. These invention problems are solved by the main claim 1 and the independent claims 4 and 7. Advantageous extensions of the main claim and the independent claims are described in dependent claims.

SUMMARY OF THE INVENTION

The essential and advantageous aspects of the technical solutions to the invention problems featured in the main claim and independent claims comprise the following:
Solution to the Main Problem A high-voltage oscillating circuit (I), connected in parallel with the auxiliary circuit-breaker (Ba) by firing the spark gap (SGhv), and the oscillating current (ihv) superimposed on the high current (ihJ with opposite polarity just before the high-current zero crossing.

The spark gap ($SG_{hc}$) is fired at the artificial current zero, causing: short-circuiting of the high-current source (G), series connection of the high-voltage oscillating circuit (I) with the test circuit-breaker (BJ with an unchanged structure, oscillating current from the auxiliary circuit-breaker is transferred with constant parameters alternately to the test circuit-breaker therein following the eliminated high current.

Homogeneous voltage from the high-voltage oscillating circuit continuously follows the zero crossing of the synthetic current with high-current and oscillating current-sequence current components in the test circuit-breaker.
Rationalization Effects Transformer economized in the high-current circuit as result of technically reduced switching arc voltage and eliminated risk of overvoltage for the generator; a low voltage generator can be used should the occasion arise.

High-current switching spark gap used for two purposes in a synthetic universal test circuit for short-circuit current, making and breaking tests according to the relevant IEC Test duties.

At very high rated voltages of the test circuit-breaker the transient voltage is simulated by superimposing voltages ($u_{hv}+\bar{u}_{hv}$) by means of the high-voltage oscillating circuits (I) and (II) analogous to the simulated high current, as a result of current sequence ($i_{hc}/i_{hv}$) by means of a high-current circuit and a high-voltage oscillating circuit (I)

Synthetic test circuit simulating high current and transient high voltage proven identically makes saving expensive comparative tests.

BRIEF DESCRIPTION OF THE DRAWINGS

The solutions to the invention problems are explained below in more detail with the aid of drawings of the prior state of the art (FIGS. 1 to 5) and exemplary embodiments of the present invention (FIGS. 6 to 22).

The figures show the following.

DETAILED DESCRIPTION OF THE PREFERRED EMBODIMENT

The essential components of the high-current circuit (FIG. 6) are as follows: a generator G as the high-current source, either with or without a transformer connected in series and with the inductance $L_{hc}$ which may also include an additional current-limiting inductance, a master circuit-breaker MB, a making switch MS, an auxiliary circuit-breaker $B_a$ and a test circuit-breaker $B_t$.

Figures 6, 14:
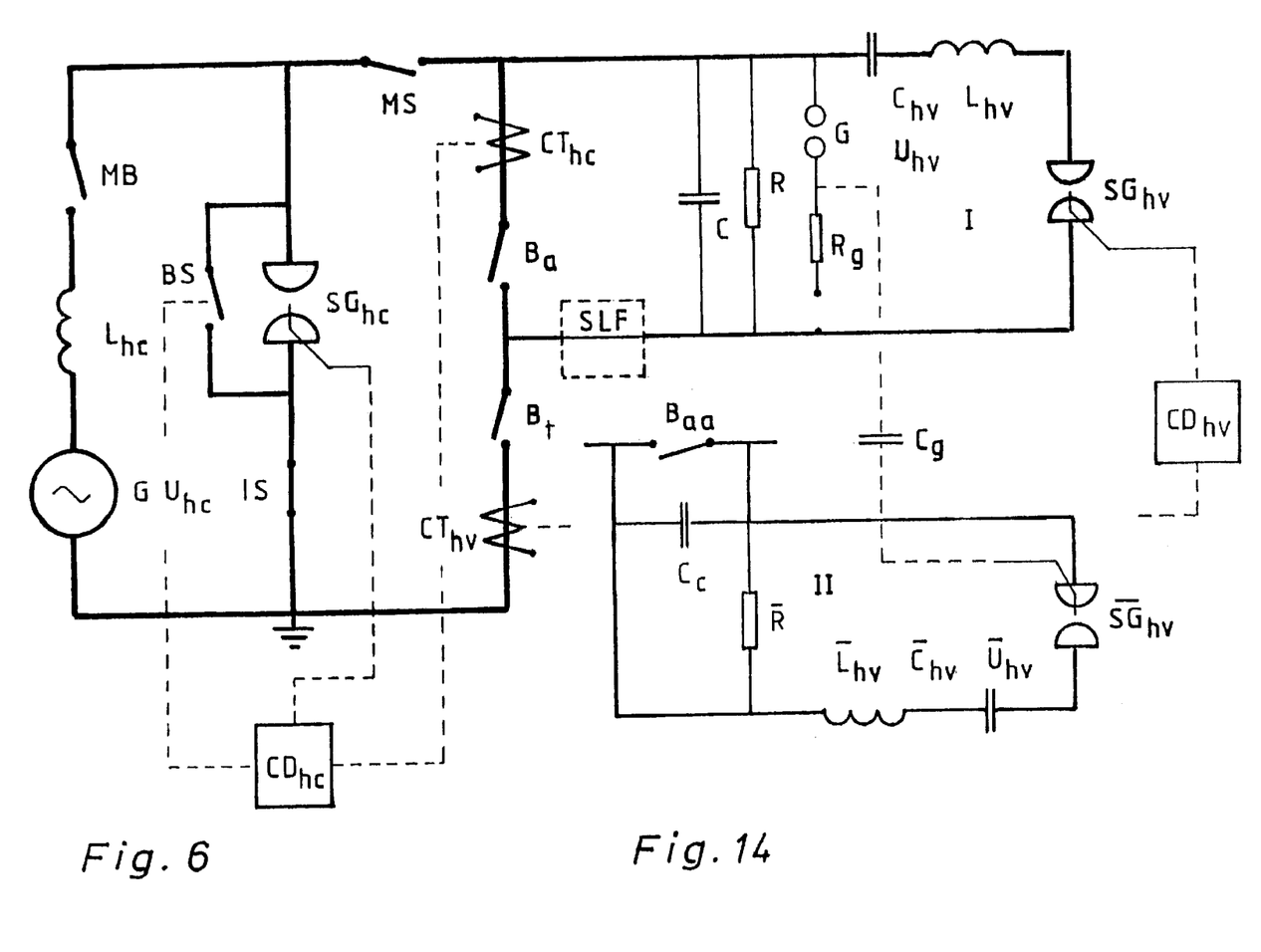
FIG. 6 is a circuit diagram of a synthetic breaking-capacity test circuit with a high-current circuit and a high-voltage oscillating circuit I.
FIG. 14 is a circuit diagram of high-voltage oscillating circuit II.

The essential components of high-voltage oscillating circuit I are as follows: a capacitance $C_{hv}$ which can be charged to high electrical potential as the high-voltage source, an inductance $L_{hv}$, a spark-gap $SG_{hv}$ and possibly a high-voltage overhead-line section or its simulation (SLF=short-line fault circuit) for the corresponding tests.

The high-current circuit and high-voltage circuit I cooperate as follows in order to test the breaking capacity.

Figure 7:
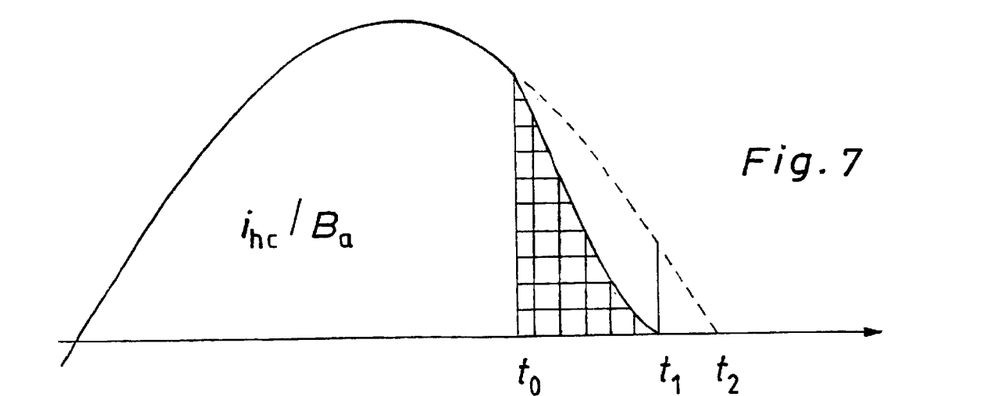
FIG. 7 is a high-current half-oscillation in the auxiliary circuit-breaker with superimposed oscillating current up to the artificial zero crossing.
Figure 8:
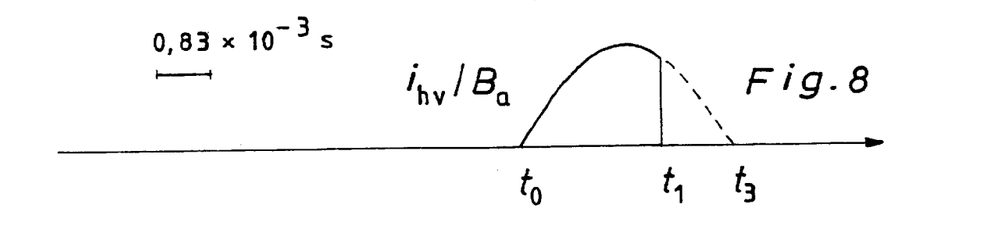
FIG. 8 is an oscillating-current flow in the auxiliary circuit-breaker up to the point at which it is transferred to the test circuit-breaker.
Figures 9, 10:
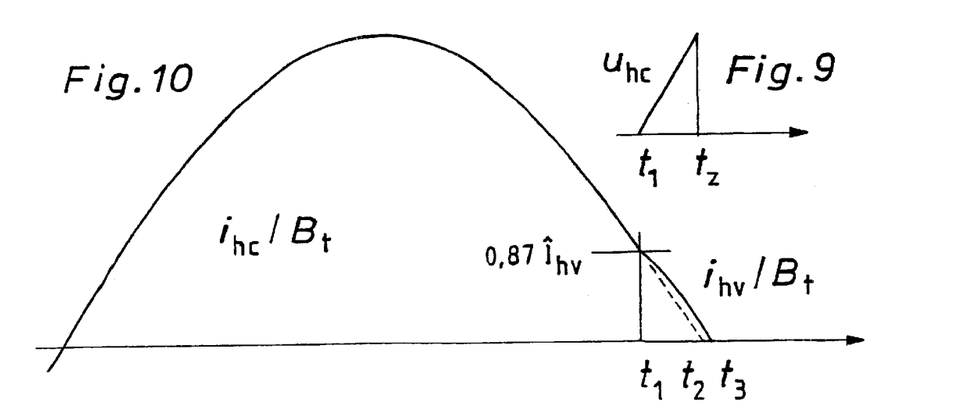
FIG. 9 is a transient voltage of the high-current circuit up to the point at which the high-current switching spark gap is fired.
FIG. 10 is a synthetic current $i_{hc}/i_{hv}$ in the test circuit-breaker.

High-voltage oscillating circuit I is connected in parallel with the auxiliary circuit-breaker whereas the switching spark gap is still open. The circuit-breakers MB, $B_a$ and $B_t$ are closed. The making switch MS makes the high current $i_{hc}$, for example, without a DC component (FIGS. 7 and 10). A control-device $CD_{hv}$ connected to a current-transformer $CT_{hv}$ fires the switching spark gap $SG_{hv}$ at the instant to (FIGS. 7 and 8) before the zero crossing of the arc half-oscillation of the high current in the auxiliary and test circuit-breakers. An oscillating current $i_{hv}$ (FIG. 8) is superimposed on the high current $i_{hc}$ with opposite polarity (FIG. 7). The auxiliary circuit-breaker interrupts this current at the zero crossing of the resulting current (instant $t_1$, FIG. 7, instantaneous value of the oscillating current equal to 0.87 $I_{hv}$, ≅120 degrees phase, FIG. 10). The voltage $U_{hc}$ of the high-current generator G oscillates with a relatively high frequency of, for example, 13 kHz to a value corresponding in practice to the artificial current zero.

Figure 11:
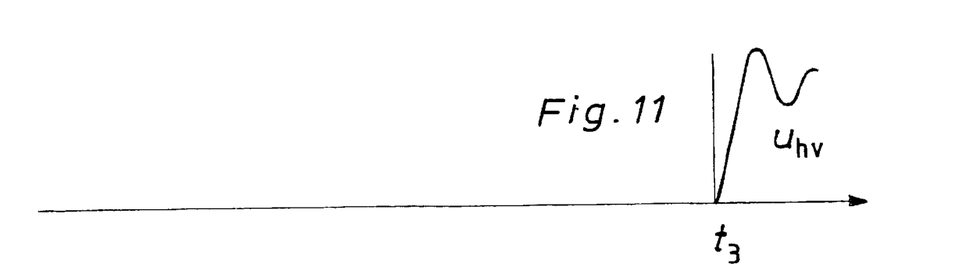
FIG. 11 is a transient voltage of the high-voltage oscillation circuit following the synthetic current half-oscillation.

During the rise time of the transient voltage of the high-current generator, for example at 30 kV, the high-current spark gap $SG_{hc}$ is fired at the instant $t_z$ (FIG. 9). High-voltage oscillating circuit I is thus connected in series to the test circuit-breaker $B_t$ with an unchanged structure and the high current is eliminated from it. The oscillating current is transferred synchronously, and with constant parameters, as sequence current to the test circuit-breaker, and at the next zero crossing (instant $t_3$, FIG. 10)—which it reaches with at least approximately the same gradient as the homogeneous high current to be simulated would do—the voltage $U_{hv}$ of high-voltage oscillating circuit I oscillates to a steady-state value (FIG. 11) at the dielectrically regenerated switching gap of the test circuit-breaker. The transient voltage $U_{hv}$ can be matched to a curve, for example one specified by international recommendations, with the capacitor C and the ohmic resistor R at the terminals of the test circuit-breaker, whereby circuit connections of C and R other than those shown here are also feasible. The short-line fault circuit SLF can be inserted into a conductor section of high-voltage oscillating circuit I, in order to test the breaking capacity under short-line fault conditions.

In a variant, the oscillating current changes from superimposed current in the auxiliary circuit-breaker ($i_{hv}/B_a$, FIG. 7) to sequence current in the test circuit-breaker ($i_{hv}/B_t$, FIG. 10) at $(i_{hv}=i_{hc})=0.5$ $Î_{hv}$≅150 degrees phase angle (FIG. 12).

The associated currents and frequencies behave as follows:

$Î_{hv}$: $Î_{hc}$=1:5, $f_{hv}$:$f_{hc}$=5:1.

A phase difference of $(t_3-t_2)$=14.49 µs is calculated between the zero crossings of synthetic current and fictitious, homogeneous current. The at zero current regeneration time ti to t3 for the auxiliary circuit-breaker is calculated as 333.33 µs.

During the current-injection interval in the auxiliary circuit-breaker, the curve of the resulting current remains well below the associated, sinusoidal high-current curve. Assuming constant arc voltage, the arc energy is proportional to the area below the resulting current curve (FIG. 12) and is highlighted in FIG. 7 by means of squares. The calculation yields a reduction of around 40% in arc energy.

If the contacts of the auxiliary circuit-breaker are not separated until the start of the current injection interval which reduces the arc energy in the switching gap of the auxiliary circuit-breaker, regeneration of the dielectric strength in the zero current—and in practice also dead—interval from $t_i$ to $t_3$ following the current zero is considerably speeded up (FIGS. 10 and 12); the auxiliary circuit-breaker withstands a higher transient voltage for the same period.

The number of interrupter units for an auxiliary circuit-breaker with multiple interrupter units, for example, can be reduced accordingly. The resulting arc voltage in the high-current circuit is thus reduced by approximately half, for instance, and as a further consequence its impact on the final half-oscillation of the high current: reduction of the amplitude and the current flow time. The source voltage of the high-current circuit can subsequently be reduced as well, for example from 36 kV to 19 kV, meaning in practice: economizing high-current transformers. If medium and high-voltage vacuum circuit-breakers are to be tested, either a low-voltage high-current generator or a technically and economically optimized combination of a generator and a step-down transformer can be used to generate the high current at low potential.

It is also an advantage to trip the auxiliary circuit-breaker in such a way that the contacts already have a relative speed at the instant of separation. A sequential contact is used for this purpose instead of the stationary contact on circuit-breakers with butt contacts.

If the time interval from $t_0$ through $t_1$ to $t_3$ is too short at higher frequencies of the high-voltage oscillating current $i_{hv}$ to permit the contact of the auxiliary circuit-breaker to reach the safe quenching distance, the contact separation can instead take place just before $t_0$.

Similarly, if the time interval from $t_0$ to $t_3$ at relatively low oscillating-current frequencies is longer than actually necessary for the contacts to reach the safe quenching distance, the contact separation can take place just after $t_0$.

Gas-blast circuit-breakers or vacuum circuit-breakers with, as already indicated, reduced switching-arc energy relative to the test circuit-breaker are suitable as auxiliary circuit-breakers. Vacuum circuit-breakers are either equipped with disk-type butt contacts or they have generally cup-shaped contact arrangement with winding sections to produce a radial or axial magnetic field.

The current curve for the synthetic test circuit with superimposed current and sequence current in the test circuit-breaker is also shown for the sake of comparison (FIG. 12, discontinuous polyline): the oscillating current appears in the test circuit-break as injection current, $i_{hv}/B_t$, at the instant $t_0'$. After the current interruption in the auxiliary circuit-breaker (instant $t_2$), the oscillating current continues to flow, also starting with $(i_{hv}/B_t)t2$=0.5 $Î_{hv}$, as sequence current in the test circuit-breaker ($i_{hv}/B_t$). The zero crossings occurs at the instant $t_3'$.

The phase difference between the zero crossings of synthetic high current ($t_3'$) and homogeneous high current ($t_2$) is calculated directly as 333.33 µs and is identical to the sequence current duration.

The synthetic high current, consisting of superimposed current and sequence current, is evidently significantly distorted compared to the homogeneous high current.

This current distortion also causes a significant increase in the thermal energy stress on the switching gap of the test circuit-breaker.

In order to obtain information about the equivalence of the stress on the test circuit-breaker in the synthetic test circuit which is the object of this invention to the stress on the same circuit-breaker in a direct test circuit, the arc energy which is released in the switching gap during the flow time of the sequence current ($t_1$ to $t_3$, FIG. 12) is determined and referred to the arc energy of a homogeneous high current with the same flow time up to the zero crossing; the arc voltage is assumed to be constant and of equal magnitude in both cases.

Figure 13:
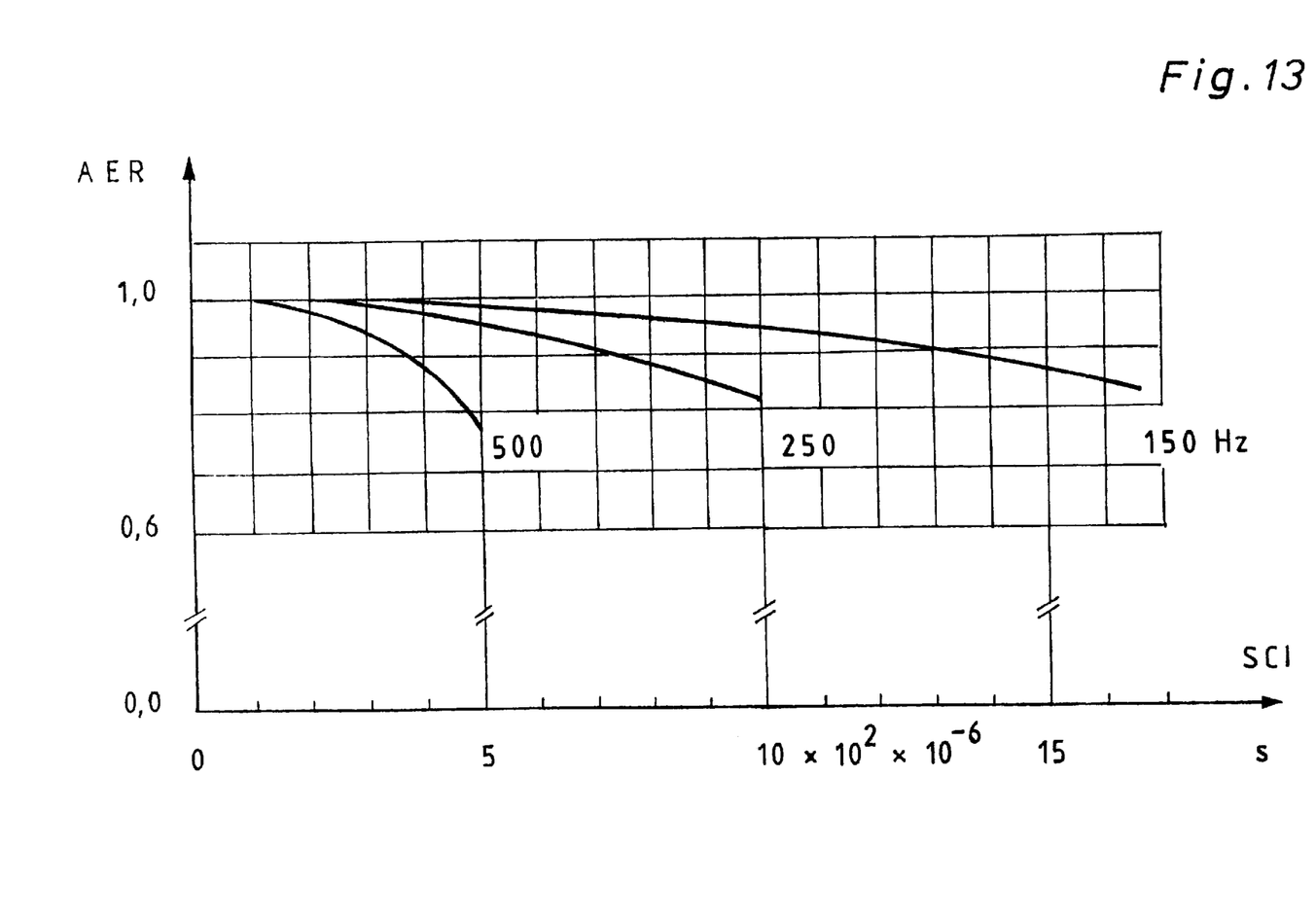
FIG. 13: is an arc energy ratio (AER) as a function of the sequence current duration (SCD)

The ratio of these arc energies (AER) as a function of the sequence current interval (SCI)—whereby the latter is dependent on the transition value selected for the oscillating current—is shown in the graph in FIG. 13; the numerical values entered for the AER curves are the frequencies of the assumed oscillating currents.

As the duration of the oscillating current as sequence current decreases, the AER curves approximate the equivalence value 1, which they reach in practice when the sequence current starts with 50% of its peak value.

In order to relieve the load on the switching spark gap $SG_{hc}$ from the high-current arc, it is an advantage to use a bridging switch BS (FIG. 6) connected with a conductor section with zero potential ZP.

Figure 19:
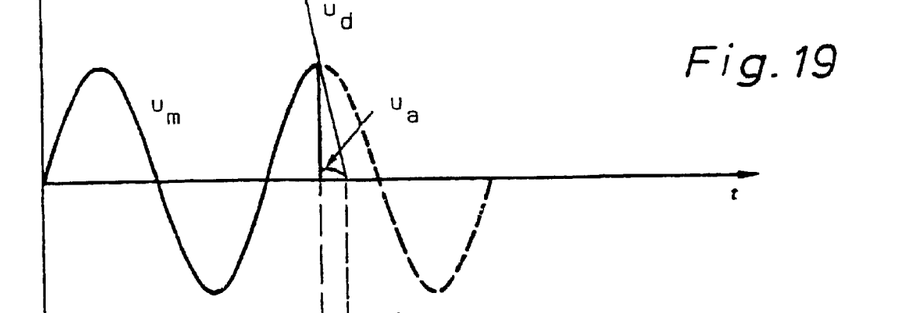
FIG. 19 is a making voltage $u_m$, dielectric making characteristic $u_d$ of the test circuit-breaker, arc voltage $u_a$.
Figure 20:
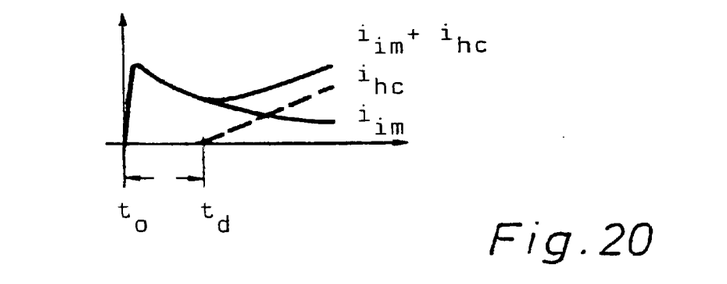
FIG. 20 is a pre-arcing current $i_{im}$ high current $i_{hc}$ as superimposed and sequence current in the test circuit-breaker, firing delay td of the spark gap.

The test of the short-circuit current making/breaking capacity of a high-voltage alternating-current circuit-breaker comprises, for example in accordance with the specification in the above-cited IEC Publication 60427, among other things closing onto a short-circuit followed immediately by an opening with interruption of the short-circuit current: "C(lose)O(pen)" switching cycle. If the master circuit-breaker MB were to be closed, the voltage of the high-current generator would fire the switching spark gap $SG_{hc}$ irregularly if the test circuit-breaker was still open. Against this, an isolating switch IS is installed in the connecting cable for this switching spark gap with zero potential and controlled during operation as follows:

Open before and during the closing test interval with making voltage applied and following pre-arcing current (FIGS. 19 and 20)

Closed at the earliest when the contacts of the test circuit-breaker are latched (FIG. 21), and remaining closed until just after the high current flowing via the spark gap $SG_{hc}$ or the bridging switch BS is interrupted by the master circuit-breaker; this instant marks the completion of the opening operation in the first CO cycle and the isolating switch is then opened to start the closing operation of the second CO cycle Alternatively, it is possible to use a switching spark gap $SG_{hv}$ with a larger electrode spacing; this gap is fired by a control device $CD_{hc}$ during the time range $t_1$ of the zero of the resulting current in the auxiliary circuit-breaker Ba, whereby this device is connected either to a current transformer $CT_{hc}$ or to a shunt (not shown).

Firing during the time range $t_1$ means: firing just before the zero crossing or at the zero crossing or just after the zero crossing of the resulting current in the auxiliary circuit-breaker. A current transformer $CT_{hc}$ or an equivalent shunt is arranged between the terminals of high-voltage oscillating circuit I at the high-current circuit (FIG. 6).

The electrodes of the switching spark gaps $SG_{hc}$ and $SG_{hv}$ can be made from a material containing at least graphite, at least in the area in which the surfaces are facing one another, in order to reduce arc erosion to a minimum. It is also useful to design the electrodes such that they are generally cup-shaped and to provide them with conventionally arched conductor sections, to enable the switching arc to rotate in a radial magnetic field. The electrodes of the switching spark gaps $SG_{hc}$ and/or $SG_{hv}$ can moreover be arranged to advantage either in an insulating gas or in a vacuum.

In order to increase the testing performance of the synthetic test circuit that is the object of this invention by superimposing a voltage corresponding to the sequence current in the switching gap of the test circuit-breaker on this switching gap, a second high-voltage oscillating circuit n with the following elements is incorporated: a capacitance $\overline{C}_{hv}$ which can be charged to electrical potential as the high-voltage source, connected in series with: an inductance $\overline{L}_{hv}$ as well as a coupling and voltage build-up capacitor $C_c$ with an ohmic resistor R connected in parallel for instance.

A measuring spark and control gap G is provided for controlled firing of the switching spark gap $\overline{SG}_{hv}$; an ohmic resistor $R_g$ and a coupling capacitor $C_g$ are arranged in the firing and control circuit.

The coupling and voltage build-up capacitor $C_c$ is connected in parallel with a second auxiliary circuit-breaker $B_{aa}$. In the application described here this circuit-breaker is inserted in high-voltage oscillating circuit I, either in place of the short-line fault circuit or in series with it; it can also be installed in the conductor section of high-voltage oscillating circuit I upstream of its second terminal at the high-voltage circuit (FIGS. 6 and 14).

The second auxiliary circuit-breaker is tripped such that it acquires a sufficient current interruption capability prior to the zero crossing of the oscillating current $i_{hv}$ (instant $t_3$, FIGS. 10 and 12); the qualities recommended above for the first auxiliary circuit-breaker $B_a$ are also useful here for this purpose. Alternatively, the second auxiliary circuit-breaker can be a switch with a switching gap bridged by a fusible wire that builds up the opening arc.

After the zero crossing of the oscillating and sequence current, the voltage of the high-voltage oscillating circuit I, $u_{hv}$, oscillates to a steady-state value (FIG. 15); it is distributed between the test circuit-breaker $B_t$ and the auxiliary circuit-breaker $B_{aa}$ in the same proportion as the coupling and voltage build-up capacitance $C_c$ to the self-capacitance of the test circuit-breaker, which is between one tenth and one hundredth of the former capacitance. Thus, for the first part of its voltage stress, almost the complete voltage of high-voltage oscillating circuit I is present at the terminals of the test circuit-breaker.

Figure 15:
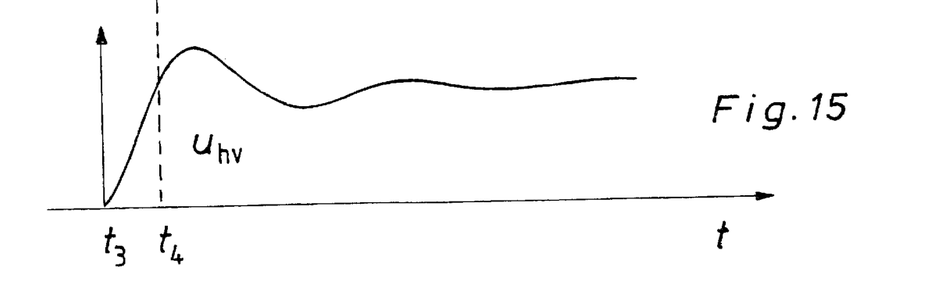
FIG. 15 is a transient voltage $u_{hv}$, high-voltage oscillating circuit I.
Figure 16:
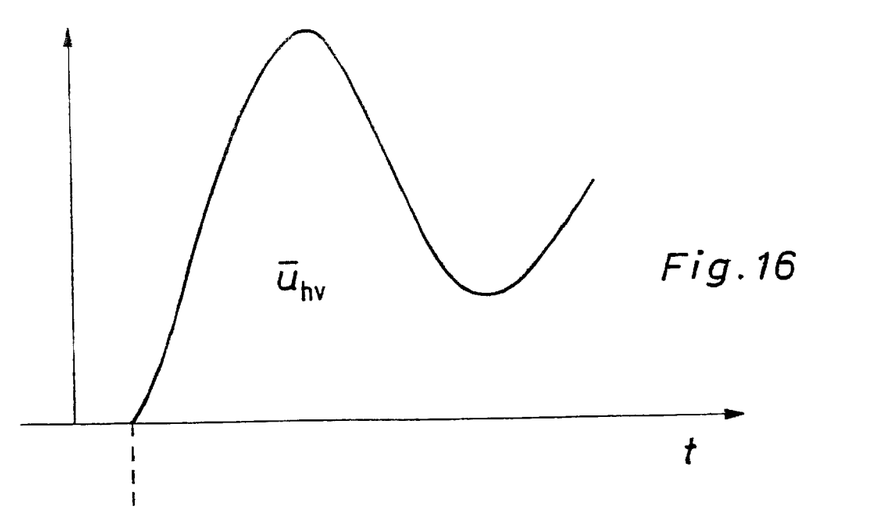
FIG. 16 is a transient voltage $\bar{u}_{hv}$, high-voltage oscillating circuit II.
Figure 17:
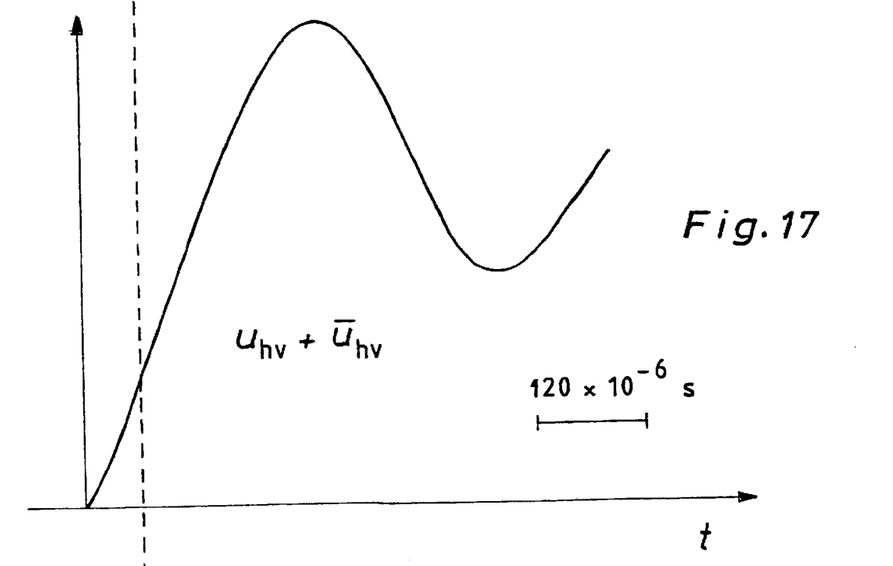
FIG. 17 is a synthetic transient voltage after superimposition of the transient voltages of high-voltage oscillating circuits I and II.

The measure spark gap is fired as soon as a defined voltage is reached (instant $t_4$, FIG. 15). The resulting high-voltage pulse at the resistor $R_g$ is transferred via the coupling capacitor $C_g$ to the starting electrode of the switching spark gap $\overline{SG}_{hv}$, which it then fires. The transient voltage $\overline{u}_{hv}$ of high-voltage oscillating circuit II is subsequently built up at the coupling capacitor $C_c$ (FIG. 16). The total voltage ($u_{hv}$+ $\overline{u}_{hv}$, FIG. 17), determined by two parameters, namely the peak value and the duration until then, tests the recovery dielectric strength of the test circuit-breaker; if both transient voltages are only slightly damped, with an amplitude factor of approximately 1.8, and if the ratio of their initial values $u_{hv}$ and $\overline{u}_{hv}$ is roughly 1:0.3, the total voltage is determined by four parameters (DIN VDE 0670, 1992–10, Part 104, FIG. 25).

The second auxiliary circuit-breaker $B_{aa}$, with high-voltage oscillating circuit II connected in parallel, can also be installed in the following positions (not shown) in the high-current circuit: in the conductor section between the terminal of high-voltage oscillating circuit I at the high-current circuit which immediately follows the test circuit-breaker and this circuit-breaker, or in the conductor section between the other terminal of high-voltage oscillating circuit I at the high-current circuit and the live terminal of the switching spark gap $SG_{hc}$.

The transient voltages of high-voltage oscillating circuits I and II, $u_{hv}$ and $\bar{u}_{hv}$, have the same polarity and add up to the total transient voltage ($u_{hv}+\bar{u}_{hv}$, FIGS. 15, 16 and 17) in both configurations of the second auxiliary circuit-breaker $B_{aa}$.

In a third possible installation configuration, the second test circuit-breaker $B_{aa}$ is arranged in the conductor section between the test circuit-breaker $B_t$ and the downstream terminal of the high-current switching spark gap $SG_{hc}$ at the high-current circuit, whereby this terminal has zero potential. The only change in the transient voltage of high-voltage oscillating circuit II ($\bar{u}_{hv}$), whish is connected in parallel, is its opposite polarity compared to the transient voltage $u_{hv}$ of high-voltage oscillating circuit I. The dielectric stress on the test circuit-breaker results fro the difference between these two transient voltages and exhibits the same curve shape as the sum of the transient voltages ($u_{hv}+\bar{u}_{hv}$) in FIG. 17.

Figure 18:
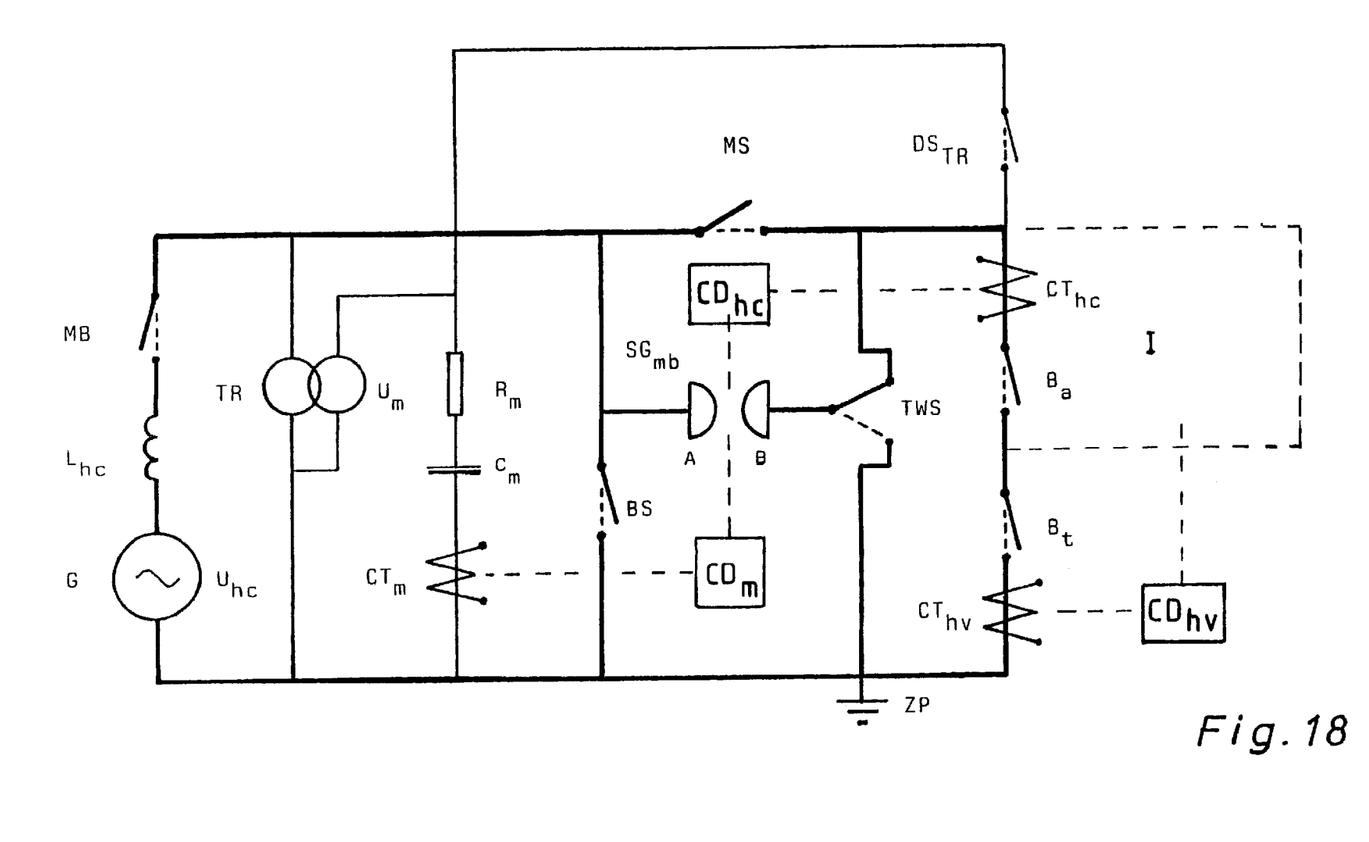
FIG. 18 is a circuit diagram of a synthetic making-capacity test circuit with a high-current switching spark gap in a two-electrode version.

In the synthetic test circuit for testing the short-circuit current making capacity of high-voltage alternating-current circuit-breakers (FIG. 18), the high-voltage circuit basically consists of a high-voltage transformer TR with a relatively low short-circuit current. The voltage winding is loaded by the series connection of a capacitor $C_m$ and an ohmic resistor $R_m$. The making high voltage $U_m$, which is synchronous with the voltage of the high-current generator $u_{hc}$, is applied by means of the closed disconnecting-switch $DS_{TR}$ to the switching gap of the test circuit-breaker. An ohmic resistor (not shown) can also be arranged in the connecting cable of the high-voltage transformer TR with the test circuit-breaker $B_t$.

In addition to the test circuit-breaker, the making switch MS is also open at the start of the short-circuit current making test. Electrode A of a two-electrode spark gap $SG_{mb}$ is connected to the high-current circuit on the generator side of this switch. Electrode B can be connected alternately to the other terminal side of the making switch by means of the two-way switch TWS or to the zero potential ZP of the high-current circuit; the first of these two connections is used to test the short-circuit making capacity.

Figure 21:
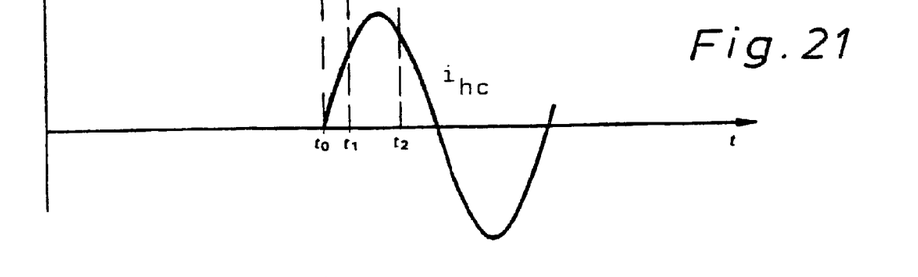
FIG. 21 is a steady-state high current $i_{hc}$, latching interval $t_1$ to $t_2$.

The dielectric strength of the making test circuit-breaker decreases along a dielectric closing characteristic $u_d$. Pre-arcing takes place at the intersection with the making voltage $u_m$ (instant $t_0$, FIG. 19). A transient initial making current $i_{tm}$, which is basically fed by the $C_m$–$R_m$ element, then flows. This current cause the switching spark gap $SG_{mb}$ to be fired by means of a control device $CD_m$ (FIG. 18) connected to the current transformer $CT_m$ (a shunt can also be used). Following the time delay $t_d$ of this control and switchin device, the high current $i_{hc}$ is initially superimposed the $i_{tm}$ current before flowing as sequence surrent (FIG. 20). The closing arc interval with the arc voltage $u_a$ (FIG. 19) continues until the contact touch (instant $t_1$); from $t_2$ onwards, the contacts of the test circuit-breaker are latched (FIG. 21). A short time after the pre-arcing in the switching gap of the test circuit-breaker, the making switch MS relieves the load on the high-current switching spark gap. The high current is interrupted by the master circuit-breaker MS.

After the test of the short-circuit current making capacity has finished and the disconnecting-switch $DS_{TR}$ has been opened, the two-way switch TWS connects electrode B of the two-electrode spark gap to the zero potential of the high-current circuit (FIG. 18) by means of a programmable operating mechanism. In this installation position the switching spark gap $SG_{mb}$ functions during the subsequent test of the short-circuit current breaking capacity as a device for eliminating high current from the test circuit-breaker $B_t$, and for transferring oscillating current to this circuit-breaker, as explained above.

Figure 22:
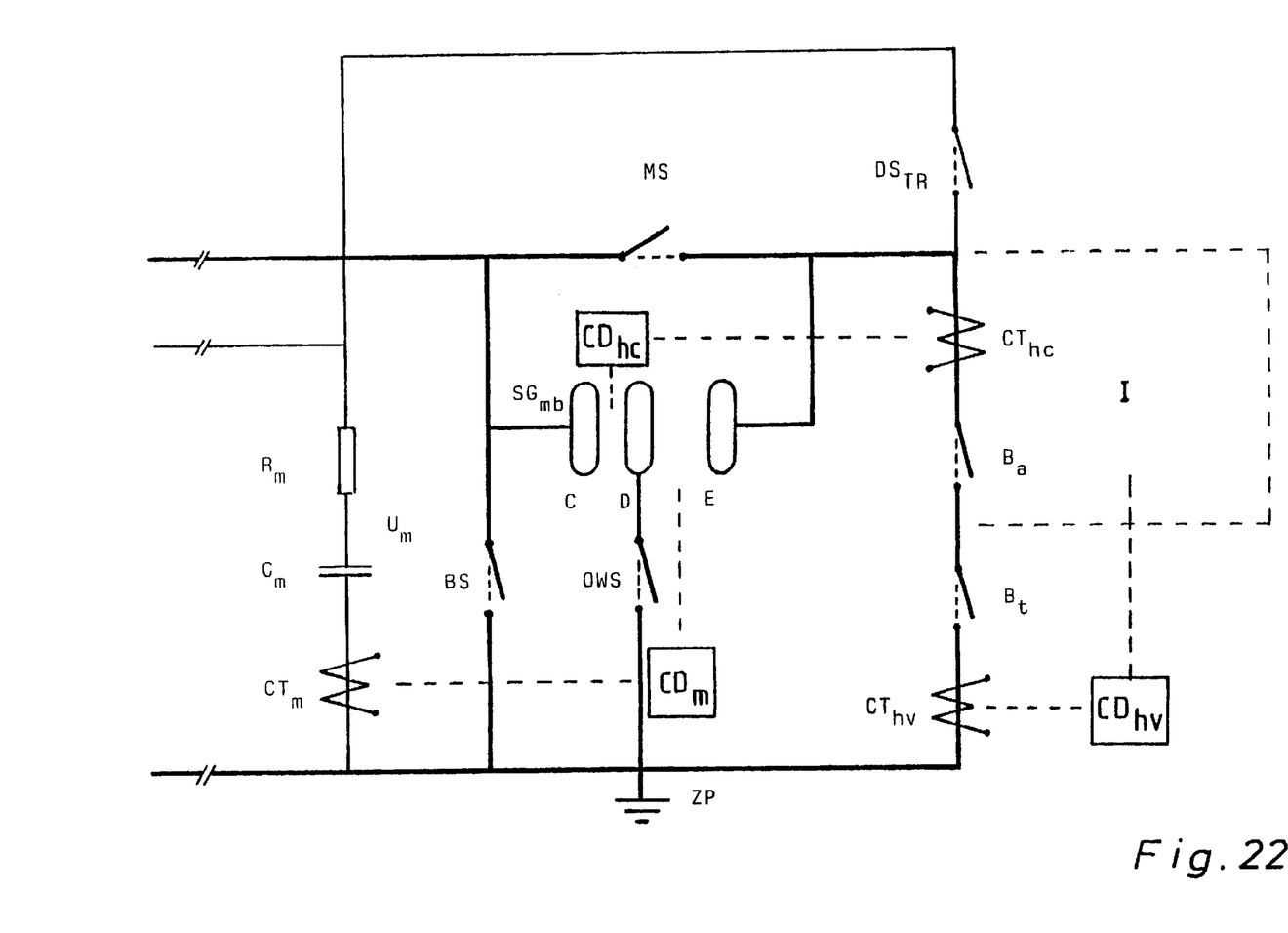
FIG. 22 is a circuit diagram of a synthetic making-capacity test circuit with a high-current switching spark gap in a three-electrode version.

FIG. 22 shows the circuit diagram of the synthetic test circuit for testing the short-circuit current making capacity, which contains only the information essential to understand the principle, when a three-electrode high-current switching spark gap $SG_{mb}$ is used.

Electrode C is connected to the high-current circuit on the high-current generator side of the making switch MS; the central electrode D can be either connected to the conductor section, which has zero potential, by means of a one-way switch OWS or isolated from this section. Electrode E is connected to the high-current circuit on the opposite installation side of the making switch.

When the disconnecting-switch transformer circuit $DS_{TR}$ is closed and the one-way switch OWS is opened, the difference between the voltage $U_m$ of the high-voltage transformer TR and the voltage $U_{hc}$ of the high-current generator is present at the three-electrode spark gap. The pre-arcing current in the switching gap of the making test circuit-breaker ($i_{tm}$, FIG. 20) causes the three-electrode spark gap to be fired by means of the control device $CD_m$ connected to the current transformer $CT_m$. The subsequent shape of the current curve in the test circuit-breaker resembles that described above for the two-electrode spark gap. The load on the three-electrode spark gap from the current $i_{hc}$ is similarly relieved shortly after the pre-arcing in the rest circuit-breaker when the making switch MS is closed.

The one-way switch OWS is next to closed for the subsequent test of the short-circuit current breaking capacity. The high-current switching spark gap, which for this test consists of electrodes C and D, fires the control device $CD_{hc}$ connected to the current transformer $CT_{hc}$ during the time range $t_1$ (FIGS. 10 and 12) of the artificial current zero in the first auxiliary circuit-breaker $B_a$; all other switching operations are identical to the synthetic short-circuit current breaking-capacity test circuit described above, which is the object of the invention.

The one-way switch OWS, the making switch MS and the bridging switch BS—the latter is also installed if the two-electrode high-current switching spark gap is used (FIG. 18), and is not closed there until during the breaking-capacity test in order to relieve the high current load on this spark gap—are switched over from their last positions during the making-capacity test to their required starting positions for the breaking-capacity test and vice versa in this synthetic universal test circuit by means of a control device (not shown) according to a preset program.

What is claimed is:

1. A synthetic making/breaking-capacity test circuit for high-voltage alternating-current circuit-breakers with a high-current circuit, containing at least one high-current source (G) connected in series with a test circuit-breaker ($B_t$) and at least one auxiliary circuit-breaker ($B_a$), and a high-voltage oscillating circuit (I), containing a high-voltage source ($C_{hv}$) and connectable to the high-current circuit before the zero crossing of the partial oscillation of a high current, wherein during the high-current partial oscillation ($i_{hc}$), the high-voltage oscillating circuit is connected in parallel with the auxiliary circuit-breaker by means of a switching device ($SG_{hv}$), whereupon an oscillating current ($i_{hv}$) of the high-voltage oscillating circuit is superimposed on the high current in the auxiliary circuit-breaker with opposite polarity and the resulting current exhibits a zero crossing during the partial oscillation of the high current;

switching devices ($SG_{hc}$) connect the high-voltage oscillating circuit in series with the test circuit-breaker, to the exclusion of the high-current circuit, during the time range of the zero crossing of the resulting current in the auxiliary circuit-breaker, whereupon the oscillating current is transferred in the test circuit-breaker as sequence current of the high current eliminated from said circuit-breaker;

the sequence current ($i_{hv}$) in the test circuit-breaker tends towards zero with at least approximately the same gradient as the high current that must be simulated synthetically, whereupon a voltage ($U_{hv}$) of the high-voltage oscillating circuit oscillates to an ultimate magnitude at the switching gap of the test circuit-breaker.

2. The test circuit of claim 1, wherein:

the oscillating current ($i_{hv}$) is superimposed on the high current ($i_{hc}$) in the auxiliary circuit-breaker ($B_a$) with opposite polarity at an instant ($t_0$), whereupon this oscillating current is transferred to the test circuit-breaker ($B_t$) with an initial value that is less than or equal to 95% of its peak value ($I_{hv}$) as sequence current of the high current ($i_{hc}$).

3. The test circuit of claim 1, wherein:

a second auxiliary circuit-breaker ($B_{aa}$) is arranged either in a conductor section of the high-voltage oscillating circuit (I) or in the high-current circuit, and therein either in the conductor section between one of the two terminals of the high-voltage oscillating circuit (I) at the high-current circuit and the test circuit-breaker ($B_t$) in this circuit or in the conductor section between the other terminal of the high-voltage oscillating circuit (I) and the terminal of the high-current switching spark gap ($SG_{hc}$), which has electrical potential, or in the conductor section between the test circuit-breaker ($B_t$) and the terminal of the high-current switching spark gap ($SG_{hc}$) at the high-current circuit, which has zero potential, whereby at least one capacitance ($C_c$) is connected in parallel with the second auxiliary circuit-breaker in one of the above-mentioned configurations, and this capacitance as well as a series circuit comprising at least one inductance ($\overline{L}_{hv}$) and one capacitance ($\overline{C}_{hv}$), which may also act as a high-voltage source, are connected to a high-voltage oscillating circuit (II) synchronously with a defined value of the transient voltage ($U_{hv}$) of the high-voltage oscillating circuit (I); the transient voltage ($\overline{u}_{hv}$) of the high-voltage oscillating circuit (II), which is generated at the second auxiliary circuit-breaker, in the sum or difference with the transient voltage ($u_{hv}$) of the high-voltage oscillating circuit (I) exerts a dielectric stress on the switching gap of the test circuit-breaker ($B_t$).

4. A synthetic making/breaking-capacity test circuit for high-voltage alternating-current circuit-breakers with a high-current circuit, containing at least one high-current source (G) connected in series with a test circuit-breaker ($B_t$) and at least one auxiliary circuit-breaker ($B_a$), and a high-voltage oscillating circuit (I), containing a high-voltage source ($C_{hv}$) and connectable to the high-current circuit before the zero crossing of the partial oscillation of a high current, wherein:

gas-blast circuit-breakers or vacuum circuit-breakers are used as auxiliary circuit-breakers, at least in the high-current circuit, whereby the opening of the auxiliary circuit-breaker is timed such that its contacts are separated: just before an oscillating current ($i_{hv}$) starts to be injected into a high current ($i_{hc}$) or at the instant this oscillating current starts to be injected or just after this oscillating current starts to be injected; the high current is injected with the oscillating current either in the switching gap of the auxiliary circuit-breaker or in the switching gap of the test circuit breaker.

5. The test circuit of claim 4, wherein the contacts of the auxiliary circuit-breaker have a relative speed at the instant of separation.

6. The test circuit of claim 4, wherein in the high-current circuit the generator is connected to the auxiliary circuit-breaker ($B_a$) and the test circuit-breaker ($B_t$), either without an interconnected transformer or with an interconnected transformer to increase the generator current.

7. A synthetic making/breaking-capacity test circuit for high-voltage alternating-current circuit-breakers with a high-current circuit, containing at least one high-current source (G) connected in series with a test circuit-breaker ($B_t$) and at least one auxiliary circuit-breaker ($B_a$), and a high-voltage oscillating circuit (I), containing a high-voltage source ($C_{hv}$) and connectable to the high-current circuit before the zero crossing of the half-wave of a high current, wherein:

a high-current switching spark gap ($SG_{mb}$) is connected as a component of the high-current circuit in parallel alternately: either to a making switch (MS) installed in the high-current circuit, whereby a control device ($CD_m$) which is triggered by the current in the test circuit-breaker causes the high-current switching spark gap to be fired, or to at least one auxiliary circuit-breaker connected in series with the test circuit-breaker, whereby a control device ($CD_{hc}$) which is triggered by the current in the auxiliary circuit-breaker causes the high-current switching spark gap to be fired.

8. The test circuit of claim 7, wherein the high-current switching spark gap takes the form of a two-electrode spark gap, whereby one electrode (A) is connected to the high-current circuit on the high-current source side of the making switch and the other, opposite, electrode B is connected by means of a two-way switch (TWS) either to the opposite terminal side of the making switch or to a conductor section of the high-current circuit with zero potential (ZP) in a parallel connection with the auxiliary circuit-breaker and the test circuit-breaker.

9. The test circuit of claim 7, wherein the high-current switching spark gap ($SG_{mb}$) takes the form of a three-electrode spark gap, whereby the outer electrodes (C) and (E) are connected in parallel with the making switch in the high-current; the inner electrode (D), on the other hand by means of a one-way switch (OWS), is either isolated from a conductor section of the high-current circuit with zero potential (ZP) or connected to this conductor section in a parallel connection with the auxiliary circuit-breaker and the test circuit-breaker.

* * * * *